United States Patent
Hsiao et al.

(10) Patent No.: US 9,853,658 B1
(45) Date of Patent: Dec. 26, 2017

(54) DIGITAL TO ANALOG CONVERTER CIRCUIT AND DIGITAL TO ANALOG CONVERSION METHOD

(71) Applicant: RICHTEK TECHNOLOGY CORPORATION, Zhubei, HsinChu (TW)

(72) Inventors: Ming-Jun Hsiao, Zhubei (TW); Zong-Yi Chen, Changhua (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 0 days.

(21) Appl. No.: 15/639,825

(22) Filed: Jun. 30, 2017

(30) Foreign Application Priority Data

May 17, 2017 (TW) .............................. 106116235 A

(51) Int. Cl.
*H03M 3/00* (2006.01)

(52) U.S. Cl.
CPC .............. *H03M 3/50* (2013.01); *H03M 3/438* (2013.01)

(58) Field of Classification Search
CPC .......... H03M 3/50; H03M 3/438; H03M 3/30; H03M 1/12; H03M 3/412
USPC .................................................. 341/155, 143
See application file for complete search history.

(56) References Cited

U.S. PATENT DOCUMENTS

| 4,689,802 | A * | 8/1987 | McCambridge | H03K 7/08 332/109 |
| 7,304,594 | B2 * | 12/2007 | Sakura | H04B 14/026 341/110 |
| 8,044,690 | B2 * | 10/2011 | Patel | H03F 3/217 327/131 |
| 9,087,524 | B2 * | 7/2015 | Suzuki | G11B 7/094 |
| 2013/0169173 | A1 * | 7/2013 | Chen | H05B 37/02 315/186 |

* cited by examiner

*Primary Examiner* — Jean B Jeanglaude
(74) *Attorney, Agent, or Firm* — Tung & Associates

(57) ABSTRACT

A DAC circuit includes: a PWM encoding circuit for converting a digital signal to first and second PWM signals, whereby a combination of the first and second PWM signals becomes a PWM encoded signal of at least 3 levels including a positive, a zero and a negative level, wherein the digital signal represents a number in a numerical range; and a demodulation circuit for generating the analog signal according to the first and second PWM signals. The first and second PWM signals have a minimum duty larger than 0 when the digital signal represents a middle number in the numerical range. The zero level of the combination of the first and second PWM signals has a duty which decreases as a difference between the number represented by the digital signal and the middle number increases.

20 Claims, 4 Drawing Sheets

DIGITAL TO ANALOG CONVERTER CIRCUIT AND DIGITAL TO ANALOG CONVERSION METHOD

CROSS REFERENCE

The present invention claims priority to Taiwan 106116235, filed on May 17, 2017.

BACKGROUND OF THE INVENTION

Field of Invention

The present invention relates to a digital to analog converter circuit; particularly it relates to a digital to analog converter (DAC) circuit which can reduce the inter symbol interference (ISI) and reduce the noise when the input level is low. The present invention also relates to a digital to analog conversion method.

Description of Related Art

In continuous time current DAC applications, inter symbol interference (ISI) is used as a typical index representing the error of the current cell under different input codes, wherein the ISI may be caused by non-idealities of for example but not limited to asymmetrical switching, clock skew, etc. An additional ISI elimination circuit is usually required in prior art to solve this problem, which increases cost.

In addition, a high performance DAC circuit usually requires a multi-bit sigma-delta modulation circuit; in this case, the static mismatch among current cells is one of the key factors to the performance of such multi-bit sigma-delta modulation circuit.

Another common problem in a prior art 2-level current DAC circuit is that the current cell keeps generating noises at the output of the DAC circuit even when the input signal is as low as 0. Therefore the noise at low input level becomes a key factor to the DAC circuit performance.

Compared to the prior art circuits mentioned above, the DAC circuit of the present invention is advantageous in being able to eliminate the ISI and reduce the low input level noise (i.e. noise when the input level is low), and the DAC performance is further improved when a multi-bit sigma-delta modulation circuit is applied thereto.

SUMMARY OF THE INVENTION

From one perspective, the present invention provides a Digital to Analog Converter (DAC) circuit, configured to operably convert a digital signal to an analog output signal, wherein the digital signal is an input signal to the DAC circuit or a modulated signal generated from the input signal, the digital signal representing a number in a numerical range, the DAC circuit comprising: a Pulse Width Modulation (PWM) encoding circuit, configured to operably convert the digital signal to a first PWM signal and a second PWM signal, whereby a combination of the first PWM signal and the second PWM signal becomes a PWM encoded signal of at least 3 levels including a positive, a zero and a negative level, wherein in one PWM cycle period, the first PWM signal includes a first predetermined number of rising edges and falling edges, and the second PWM signal includes a second predetermined number of rising edges and falling edges, wherein when the digital signal represents a middle number in the numerical range, the first PWM signal has a minimum duty larger than 0 and the second PWM signal has a minimum duty larger than 0; and a demodulation circuit, configured to operably generate the analog output signal according to the first and the second PWM signals, wherein the zero level of the PWM encoded signal has a duty which decreases as an absolute difference between the number represented by the digital signal and the middle number increases.

In one embodiment, the demodulation circuit includes: a current signal converter circuit, configured to operably generate a current output signal of at least 3 levels according to the first and the second PWM signals, wherein when the PWM encoded signal is at the zero level, the current output signal is a zero level current, wherein a noise of the zero level current is smaller than ⅕ of a noise of a current of any other level; and a filter circuit, configured to operably filter the current output signal to generate the analog output signal.

In one embodiment, the noise of the zero level current is smaller than 1/10 of the noise of the current of any other level.

In one embodiment, the zero level current is smaller than 1/10 of the current of any other level.

In one embodiment, in one PWM cycle period, for each number represented by the digital signal, each of the first and the second PWM signals includes one and only one rising edge and one and only one falling edge.

In one embodiment, when the number represented by the digital signal is larger than the middle number, a duty of the first PWM signal increases as the absolute difference between the number represented by the digital signal and the middle number increases, and when the number represented by the digital signal is smaller than the middle number, a duty of the second PWM signal increases as the absolute difference between the number represented by the digital signal and the middle number increases.

In one embodiment, the current signal converter circuit includes: a current source circuit, configured to operably generate a unit current, and plural conversion switches coupled to the current source circuit, wherein the first and the second PWM signals operate the plural conversion switches to switch a current path of the unit current for generating the current output signal with at least 3 levels, wherein when the PWM encoded signal is at the zero level, the current output signal is disconnected from the current source circuit such that the current output signal is the zero level current.

In one embodiment, each of the first and the second PWM signals has a blank time slot in the PWM cycle period, and for each number represented by the digital signal, the first PWM signal includes a first predetermined number of rising edges and falling edges outside of the blank time slot in the PWM cycle period, and the second PWM signal includes a second predetermined number of rising edges and falling edges outside of the blank time slot in the PWM cycle period.

In one embodiment, the DAC circuit further includes: an interpolation filter circuit, configured to operably filter and up-sample the input signal to generate an interpolation filtered signal; and a Sigma-Delta Modulation (SDM) circuit, configured to operably modulate the interpolation filtered signal with a multi-bit sigma-delta modulation for generating the modulated signal, wherein the modulated signal includes multiple bits.

In one embodiment, a duty of the first PWM signal determines a duty of the positive level of the PWM encoded signal, and a duty of the second PWM signal determines a duty of the negative level of the PWM encoded signal.

From another perspective, the present invention provides a digital to analog conversion method, for converting a digital signal to an analog output signal, wherein the digital signal is an input signal to a DAC circuit or a modulated signal generated from the input signal, the digital signal representing a number in a numerical range, the method comprising: converting the digital signal to a first PWM signal and a second PWM signal, whereby a combination of the first PWM signal and the second PWM signal becomes a PWM encoded signal of at least 3 levels including a positive, a zero and a negative level, wherein in one PWM cycle period, the first PWM signal includes a first predetermined number of rising edges and falling edges, and the second PWM signal includes a second predetermined number of rising edges and falling edges, wherein when the digital signal represents a middle number in the numerical range, the first PWM signal has a minimum duty larger than 0 and the second PWM signal has a minimum duty larger than 0; and generating the analog output signal according to the first and the second PWM signals, wherein the zero level of the PWM encoded signal has a duty which decreases as an absolute difference between the number represented by the digital signal and the middle number increases.

In one embodiment, the step of generating the analog output signal includes: generating a current output signal of at least 3 levels according to the first and the second PWM signals, wherein when the PWM encoded signal is at the zero level, the current output signal is a zero level current, wherein a noise of the zero level current is smaller than ⅕ of a noise of a current of any other level; and filtering the current output signal to generate the analog output signal.

In one embodiment, in one PWM cycle period, for each number represented by the digital signal, each of the first and the second PWM signals includes one and only one rising edge and one and only one falling edge.

In one embodiment, the step of converting the digital signal to a first PWM signal and a second PWM signal further includes: when the number represented by the digital signal is larger than the middle number, increasing a duty of the first PWM signal as the absolute difference between the digital signal and the middle number increases; and when the number represented by the digital signal is smaller than the middle number, increasing the duty of the second PWM signal as the absolute difference between the digital signal and the middle number increases.

In one embodiment, the step of generating the current output signal includes: generating a unit current, and switching a current path of the unit current by the first and the second PWM signals to generate the current output signal with at least 3 levels, wherein when the PWM encoded signal is at the zero level, the current output signal is disconnected from the current path to generate the zero level current.

In one embodiment, the digital to analog conversion method further includes: filtering and up-sampling the digital input signal to generate an interpolation filtered signal; and modulating the interpolation filtered signal with a multi-bit sigma-delta modulation to generate the modulated signal which includes multiple bits.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and the signal waveforms, but not drawn according to actual scale.

Figure 1A:
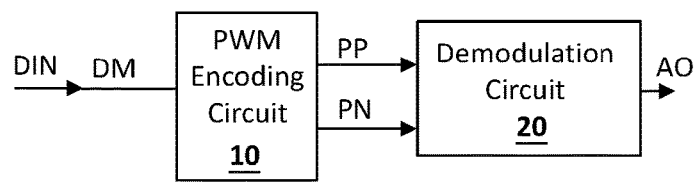
FIG. 1A shows a schematic diagram of an embodiment of the digital to analog converter circuit according to the present invention.

FIG. 1A shows one embodiment of the digital to analog converter circuit according to the present invention (DAC circuit 1A). The DAC circuit 1A converts a digital input signal DIN to an analog output signal AO, wherein the DAC circuit 1A generates a digital modulated signal DM according to the digital input signal DIN. Note that in this embodiment, the modulated signal is generated directly from the digital input signal DIN, while in other embodiments, the DAC circuit of the present invention may include a signal pre-processing circuit (for example but not limited to a sigma-delta modulation circuit which will be described in detail later) to convert the digital input signal DIN to the modulated signal DM. The digital input signal DIN or the modulated signal DM represents a number in a numerical range.

Still referring to FIG. 1A, the DAC circuit 1A comprises: a Pulse Width Modulation (PWM) encoding circuit 10 and a demodulation circuit 20. The PWM encoding circuit 10 encodes the modulated signal DM by at least 3-level PWM encoding to generate a first PWM signal PP and a second PWM signal PN (i.e., the first PWM signal PP and the second PWM signal PN are generated in such a way that a combination of the first PWM signal PP and the second PWM signal PN results in a PWM encoded signal of at least 3 levels including a positive, a zero, and a negative level). The demodulation circuit 20 generates the analog output signal AO according to the first and the second PWM signals PP and PN. In one PWM cycle period TP (FIG. 2 or 3), for each number represented by the modulated signal DM, the first PWM signal PP includes a first predetermined number of rising edges and falling edges, and the second PWM signal PN includes a second predetermined number of rising edges and falling edges. Since the first PWM signal PP has a same number of rising edges and falling edges in the PWM cycle period TP and the second PWM signal PN also has a same number of rising edges and falling edges in the PWM cycle period TP, the error of every number represented by the modulated signal DM caused by the rising edges and the falling edges of the first and the second PWM signals is the same, whereby the aforementioned ISI can be effectively reduced. Note that the first predetermined number and the second predetermined number may be the same or different. In one preferred embodiment, in the PWM cycle period TP, for each number represented by the modulated signal DM, each of the first and the second PWM signals PP and PN includes one and only one rising edge and one and only one falling edge.

Each of the first PWM signal PP and the second PWM signal PN is a 2-level PWM signal, while a combination of the first PWM signal PP and the second PWM signal PN becomes a PWM encoded signal of the modulated signal DM. Taking 3-level PWM encoding as an example, in one embodiment, a combination of PP=1 and PN=0 represents a positive level code, a combination of PP=0 and PN=1 represents a negative level code, and a combination of PP=0 and PN=0 represents a zero level code. And in a complete PWM cycle period TP, the 3-level PWM encoded signal represents the modulated signal DM by a combination of the duty of the positive level, the negative level, and the zero level.

Figure 1B:
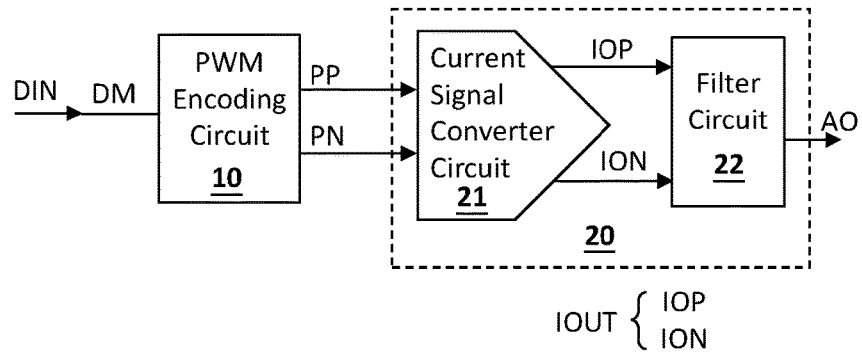
FIG. 1B shows a schematic diagram of a specific embodiment of the demodulation circuit of the digital to analog converter circuit according to the present invention.

Referring to FIG. 1B which shows a schematic diagram of a specific embodiment of the demodulation circuit (e.g. demodulation circuit 20) of the DAC circuit according to the present invention, the demodulation circuit 20 includes a current signal converter circuit 21 and a filter circuit 22. The current signal converter circuit 21 generates a current output signal IOUT of at least 3 levels according to the first and the second PWM signals PP and PN, wherein when the combination of the first and the second PWM signals PP and PN represents the zero level code (i.e., the PWM encoded signal is at the zero level), the current output signal IOUT is a zero level current (FIG. 2 or 3), wherein a noise of the zero level current is significantly smaller than a noise of a current of any other level. From one perspective, that the noise of the zero level current is "significantly smaller" than a noise of a current of any other level, can be understood as thus: when the current output signal IOUT is a zero level current, the noise is lower than that of a current any other level with a certain degree, such that the overall performance of the DAC circuit can be improved for example by one or more bits in resolution or improved with respect to the signal to noise ratio (S/N ratio). In one preferred embodiment, the noise of the zero level current is smaller than ⅕ of a noise of a current of any other level; and in one more preferred embodiment, the noise of the zero level current is smaller than ⅒ of a noise of a current of any other level. Also note that the noise of the zero level current can be reduced to be "significantly smaller" than a noise of a current of any other level by for example but not limited to: reducing the current level of the zero level current such that the noise is also correspondingly reduced. In one preferred embodiment, the zero level current is smaller than ⅒ of a current of any other level. In one preferred embodiment, the zero level current is substantially 0. Note that when the zero level current is not substantially 0, the positive level and the negative level currents may include an offset corresponding to the zero level current.

Still referring to FIG. 1B, the filter circuit 22 filters the current output signal IOUT to generate the analog output signal AO. In one embodiment, the filter circuit 22 can be omitted. In one preferred embodiment, the aforementioned current output signal IOUT may include a pair of fully differential current output signals IOP and ION; however, it may be in a non-differential form in other embodiments.

Figure 2:
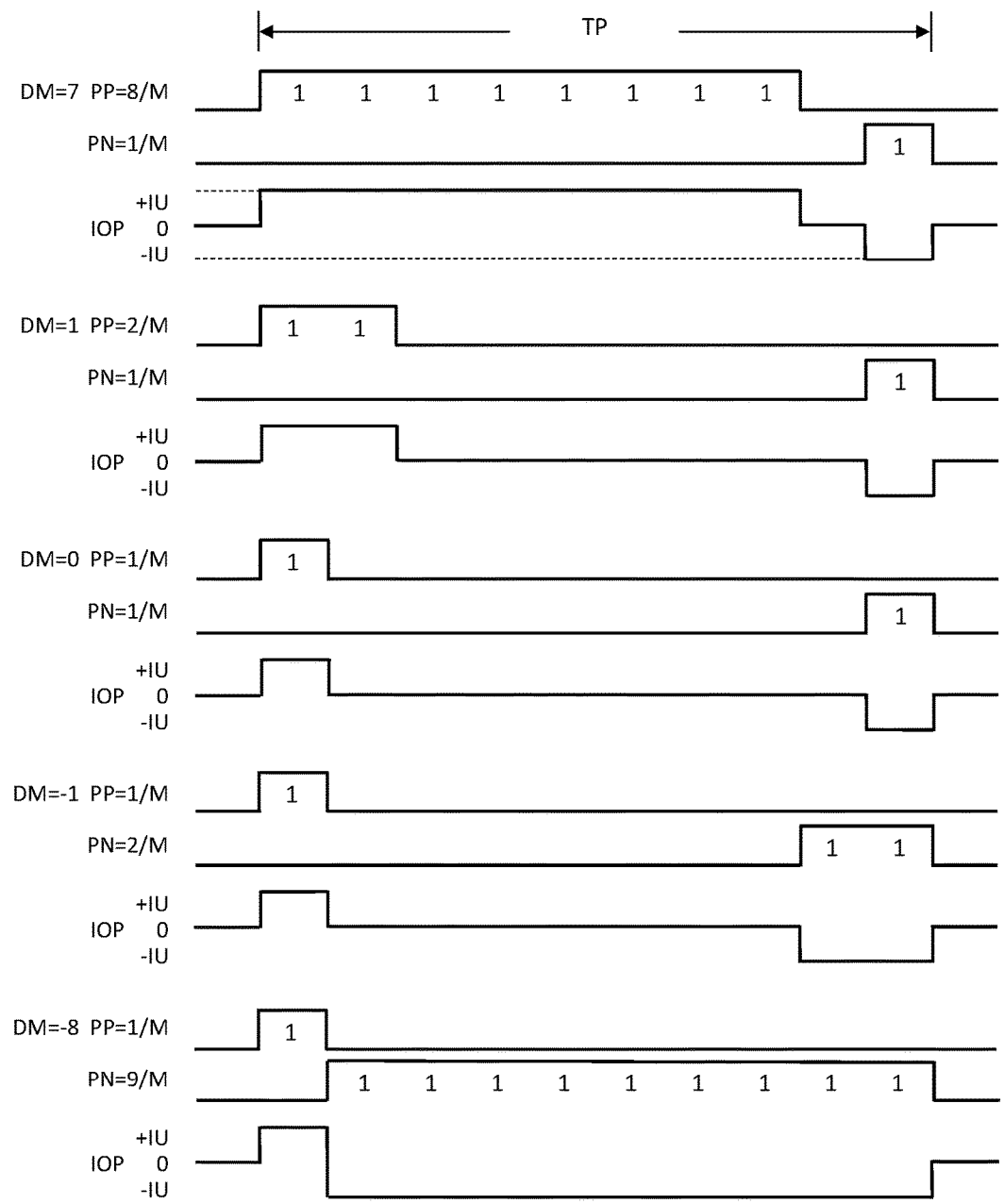
FIG. 2 shows schematic waveforms of an embodiment of the digital to analog converter circuit according to the present invention.

FIG. 2 shows schematic waveforms of an embodiment of the digital to analog converter circuit (corresponding to for example the DAC circuit 1A and 1B) according to the present invention. In combining the first and the second PWM signals PP and PN to generate the PWM encoded signal, the duty of the first PWM signal PP determines the duty of the positive level of the PWM encoded signal, and the duty of the second PWM signal PN determines the duty of the negative level of the PWM encoded signal. In this embodiment, the modulated signal DM is embodied with 4 bits, wherein the modulated signal DM has a middle number. In one embodiment, the middle number may be for example but not limited to DM=0 as shown in FIG. 2. In other embodiments, the middle number may be non-zero. In this embodiment, when the modulated signal DM is equal to the middle number (DM=0), the duty of first PWM signal PP is a minimum duty which is non-zero and the duty of the second PWM signal PN is also a minimum duty which is non-zero. In addition, the duty of the zero level of the PWM encoded signal (obtained by combination of the first and the second PWM signals PP and PN) decreases as the absolute difference between the modulated signal DM and the middle number increases. Still referring to FIG. 2, in this embodiment, the PWM cycle period TP includes M PWM time slots, wherein M is 10 in this embodiment. Note that when the modulated signal DM equals the middle number (when the number represented by the modulated signal DM is the middle number), in one PWM cycle period TP, the duty ratio of the zero level of the PWM encoded signal (i.e. the ratio of the total time length when PP=0 and PN=0 to the PWM cycle period TP) reaches a maximum (i.e. (M−2)/M). In other words, in this case, the duty of the first PWM signal PP is minimum and the duty of the second PWM signal PN is minimum (each has a duty ratio 1/M). Also as shown in FIG. 2, the duty of the zero level (PP=0 and PN=0) of the PWM encoded signal which is the combination of the first and the second PWM signals PP and PN decreases as the absolute difference between the number represented by the modulated signal DM and the middle number increases. As an example, when the number represented by the modulated signal DM is 7, the duty ratio of the zero level (PP=0 and PN=0) is (M−9)/M as shown in the figure. And when the number represented by the modulated signal DM is larger than 0, the duty of the zero level (PP=0 and PN=0) increases as the modulated signal DM decreases to 0, and the duty ratio of the zero level reaches the maximum (i.e. (M−2)/M) when the modulated signal DM is equal to the middle number (DM=0). As another example, when the number represented by the modulated signal DM is −8, the duty ratio of the zero level (PP=0 and PN=0) is (M−10)/M as shown in the figure. And when the number represented by the modulated signal DM is smaller than 0, the duty ratio of the zero level (PP=0 and PN=0) increases as the modulated signal DM (representing a negative number) increases to 0, and reaches the maximum (i.e. (M−2)/M) when the modulated signal DM is equal to the middle number (DM=0).

In other words, according to the present invention, as the number represented by the modulated signal DM becomes lower, the duty or duty ratio of the zero level of the PWM encoded signal (when PP=0 and PN=0) becomes greater. And because the noise of current output signal IOUT at the zero level current is significantly smaller than the noise of other levels in the current signal conversion circuit (e.g. current conversion circuit 21) as mentioned above, the noise of the current output signal IOUT can be effectively reduced when the modulated signal DM is at relatively lower levels, and hence the performance of the DAC circuit can be greatly improved. Also according to the present invention, because the first PWM signal PP has a same number of rising edges and falling edges and the second PWM signal PN also has a same number of rising edges and falling edges (for example one and only one in the embodiment shown in FIG. 2), the ISI can also be effectively reduced, and hence the overall performance of the DAC circuit can be greatly improved according to the present invention.

Note that the FIG. 2 is illustrating the concept of the present invention using an exemplary modulated signal DM with 4 bit, and shows only some of the numbers represented by the modulated signal DM, while the present invention can be applied to process other modulated signals with other number of bits to represent other number.

Still referring to FIG. 2, from another perspective, in one embodiment, when the modulated signal DM represents a number larger than the middle number (e.g. DM=0), the duty of the first PWM signal PP increases as the absolute difference between the modulated signal DM and the middle number increases, and when the modulated signal DM represents a number smaller than the middle number, the duty of the second PWM signal PN increases as the absolute difference between the modulated signal DM and the middle number increases.

Note that there are other arrangements to increase the duty of the zero level of the PWM encoded signal (when PP=0 and PN=0) as the absolute difference between the modulated signal DM and the middle number decreases, and the present invention is not limited to the embodiment shown in FIG. 2. Basically, as long as the duty of the zero level becomes greater as the number represented by the modulated signal DM is lower, the noise of the current output signal IOUT can be reduced, and this should be interpreted to fall within the scope of the present invention.

According to the present invention, in one embodiment, a PWM cycle period TP should be divided into $M=2^{(N-1)}+2$ time slots (M, N are positive integers) for completely encoding an N-bit modulated signal DM with 3-level PWM encoding by the first and the second PWM signals PP and PN. For example, in FIG. 2, given a modulated signal DM of 4 bits representing $-8\sim+7$, to completely encode the modulated signal DM, the PWM cycle period TP should be divided into $M=2^{(4-1)}+2$ time slots, i.e. M=10.

Figure 3:
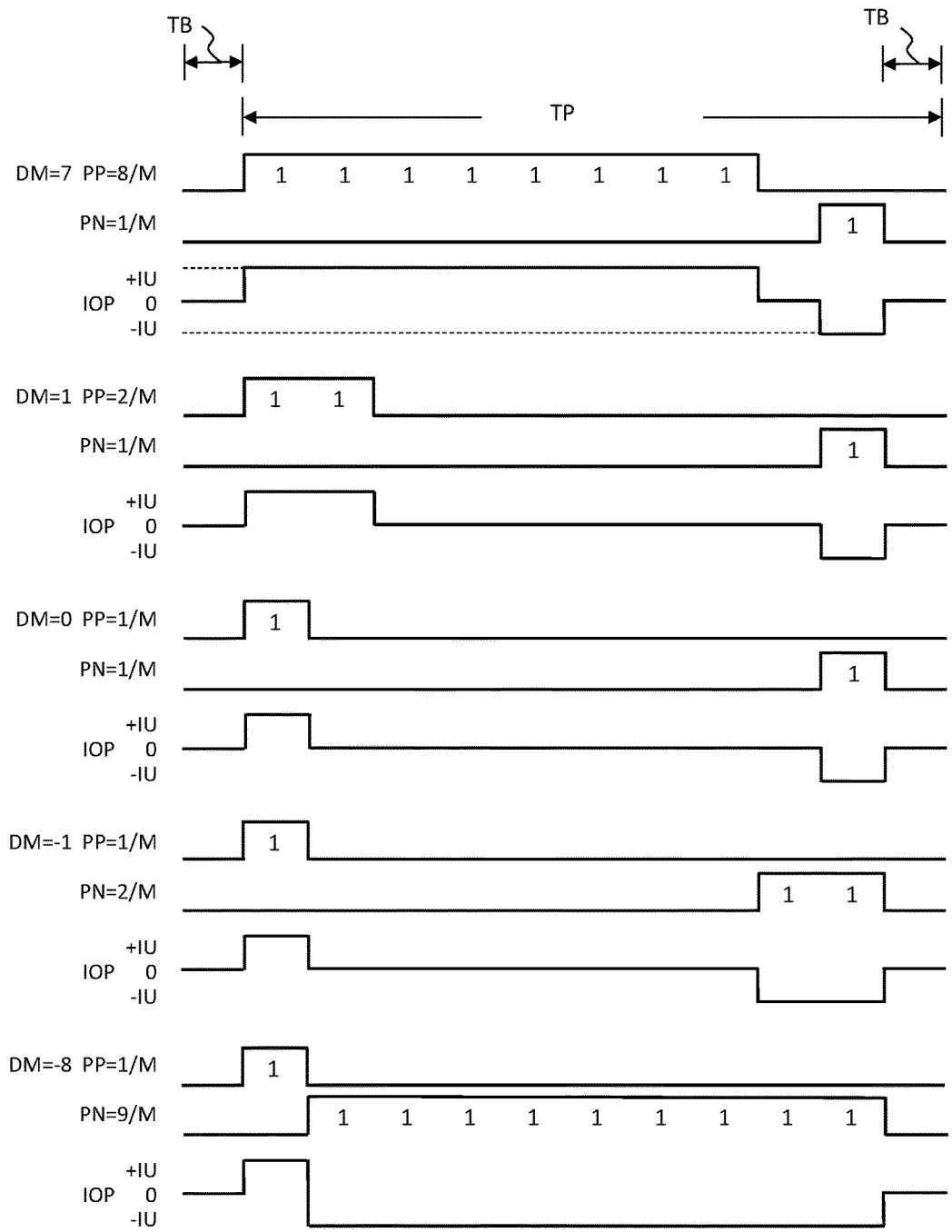
FIG. 3 shows schematic waveforms of an embodiment of the digital to analog converter circuit according to the present invention.

FIG. 3 shows schematic waveforms of an embodiment of the DAC circuit (for example corresponding to DAC circuit 1A or 1B) according to the present invention. This embodiment is similar to the embodiment in FIG. 2, but each of the first and the second PWM signals PP and PN includes a blank time slot TB within the PWM cycle period, and the rising edges and falling edges of the first and the second PWM signals PP and PN are located outside of the blank time slot TB. In this embodiment, in the PWM cycle period TP, for each number represented by the modulated signal DM, each of the first and the second PWM signals PP and PN includes one and only one rising edge and one and only one falling edge. Note that the blanking time slot TB can avoid the overlap between level transitions of the first and the second PWM signals PP and PN (e.g., the level transition of the second PWM signal PN in a previous PWM cycle period and the level transition of the first PWM signal PP in a next PWM cycle period). The PWM cycle period TP can include more than one blank time slot if required. In one preferred embodiment, the length of the blank time slot TB may be the same as one unit time slot (which equals to the minimum duty). In this case, one PWM cycle period TP should be divided into $M=2^{(N-1)}+3$ time slots (M, N are positive integers) for completely encoding an N-bit modulated signal DM with 3-level PWM encoding, i.e., including one blank time period TB and the first and the second PWM signals PP and PN. As an example, still referring to the embodiment in FIG. 2, given a modulated signal DM of 4 bits, to achieve a 3-level PWM encoding for the complete 4-bit modulated signal DM (i.e. DM represents $-8\sim+7$) plus one blank time slot, the PWM cycle period TP should be divided into $M=2^{(4-1)}+3$ time slots, i.e. M=11.

Figure 4:
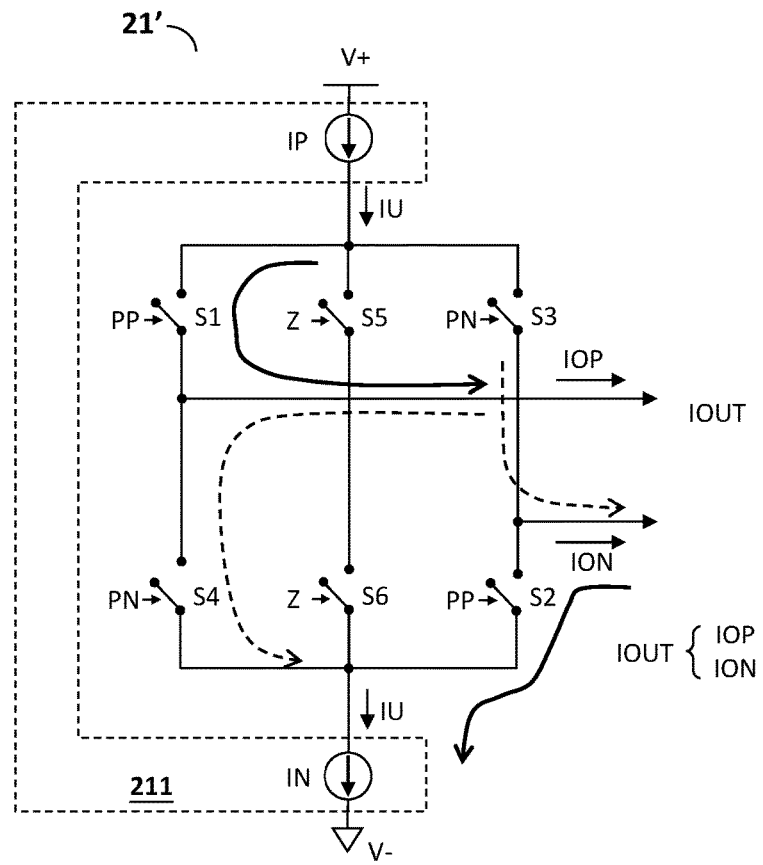
FIG. 4 shows a schematic diagram of a specific embodiment of the current signal converter circuit of the digital to analog converter circuit according to the present invention.

Referring to FIG. 4 which shows a schematic diagram of a specific embodiment of the current signal converter circuit (current signal converter circuit 21') of the DAC circuit according to the present invention, the current signal converter circuit 21' includes a current source circuit 211 and conversion switches S1-S6. The current source circuit 211 generates a unit current IU. In one embodiment, the current source circuit 211 may include current sources IP and IN coupled to a positive power V+ and a negative power V− respectively to generate the unit current IU as shown in the figure. In another embodiment, one of the current sources IP and IN may be omitted. The conversion switches S1-S6 are coupled to current source circuit 211, wherein the first and the second PWM signals PP and PN operate the conversion switches S1-S6 to switch a current path of the unit current IU, whereby a current output signal IOUT of at least 3 levels is generated.

Still referring to FIG. 4, as an example, when the combination of the first and the second PWM signals PP and PN is a positive level code (e.g. PP=1 and PN=0), the current path is as indicated by the solid arrow (for example the current output signal IOP=+IU and ION=−IU, wherein the conversion switches S1 and S2 are ON and other conversion switches are OFF). And when the combination of the first and the second PWM signals PP and PN is a negative level code (e.g. PP=0 and PN=1), the current path is as indicated by the dashed arrow (for example the current output signal IOP=−IU and ION=+IU, wherein the conversion switches S3 and S4 are ON and other conversion switches are OFF). And when the combination of the first and the second PWM signals PP and PN represents the zero level code (i.e. PP=0 and PN=0, wherein the conversion switches S5 and S6 are ON and other conversion switches are OFF), the current output signal IOUT is electrically disconnected from the current source circuit 211, so that the output is the zero level current. In this case, since both the current output signal IOP and ION are 0, the noise of the zero level current can therefore be significantly smaller than the noise of other levels (for example smaller than $10^{-3}$ of the positive or negative levels +IU or −IU). Note that the control signal Z of the conversion switches S5 and S6 can be obtained by logic operations of the first and the second PWM signals PP and PN.

Note that in one embodiment, when the combination of the first and second PWM signals PP and PN represents the zero level code, it can also be arranged in a way that the current signal conversion circuit 21' does not generate any current (e.g., disabled), which also can achieve the purpose of providing a zero level current with low noise, and should also be interpreted as one embodiment of "electrically disconnected".

The current output signal (for example the IOP shown in FIG. 2 or 3) generated by the combination of the first and the second PWM signals PP and PN corresponds to the modulated signal DM, but is in a form of 3-level PWM signal. Note that in one embodiment, the conversion switches S5 and S6 may be omitted.

Figure 5:
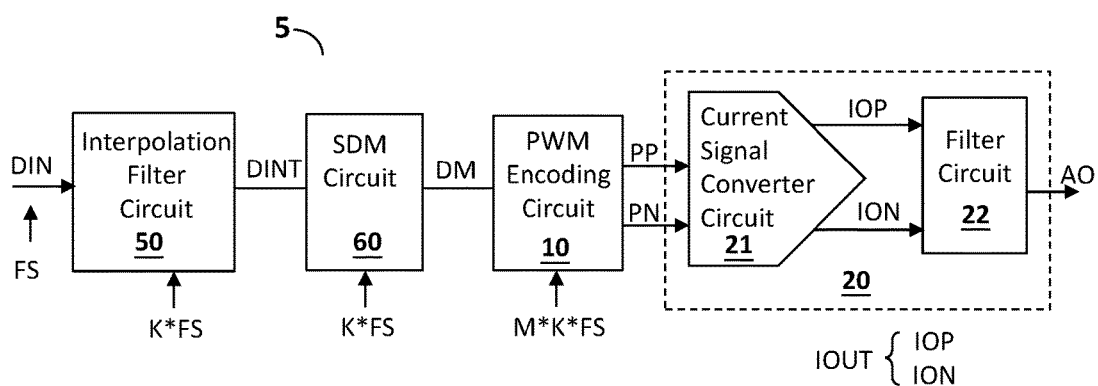
FIG. 5 shows a schematic diagram of an embodiment of the digital to analog converter circuit according to the present invention.

FIG. 5 shows a schematic diagram of an embodiment of the DAC circuit (DAC circuit 5) according to the present invention. The DAC circuit 5 is similar to the DAC circuit 1B shown in FIG. 1B, but the DAC circuit 5 further includes an interpolation filter circuit 50 and a sigma-delta modulation (SDM) circuit 60. The interpolation filter circuit 50 filters and up-samples the digital input signal DIN to generate an interpolation filtered signal DINT. And the SDM circuit modulates the interpolation filtered signal DINT with a multi-bit sigma-delta modulation, to generate the modulated signal DM which includes multiple bits. The DAC circuit 5 is applicable in for example but not limited to the digital audio system in Compact Disc (CD) or Digital Versatile Disc (DVD).

In this embodiment, the digital input signal DIN may be a digital audio source with a sampling frequency FS, and both the interpolation filtered signal DINT and modulated signal DM have a sampling frequency of K*FS whose period corresponds to the aforementioned PWM cycle period TP. In this embodiment, the SDM circuit 60 may be a multi-bit high order sigma-delta modulation circuit which has a high performance noise transfer function. In this case, the modulated signal DM is a multi-bit SDM sampling data stream. The modulated signal DM is then modulated by the aforementioned 3-level PWM encoding such that the first and the second PWM signals PP and PN operate at a frequency of M*K*FS, wherein M corresponds to the aforementioned number of time slots in one PWN cycle period.

Note that in this embodiment, after the digital input signal DIN is modulated by the interpolation filter circuit and the SDM circuit, the base band signal to noise ratio (S/N ratio) can be greatly improved by the high performance noise transfer function thereof. And the analog output signal converted from the multi-bit modulated signal DM by the aforementioned PWM encoding circuit, wherein there are the same number of rising and falling edges and the current signal conversion circuit has a low noise at low input level, can have very low ISI and noise at low input level; thus, the overall performance is greatly improved without an extra ISI elimination circuit, whereby the cost can be reduced.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. Furthermore, those skilled in this art can readily conceive variations and modifications within the spirit of the present invention. For example, in the aforementioned embodiments, a current signal conversion circuit is embodied to convert the first and the second PWM signals PP and PN to a 3-level continuous PWM signal, while in other embodiments, the conversion can be achieved by a voltage mode conversion circuit to achieve the functions described above. As another example, according to the present invention, it is not limited to encoding the complete range of the N-bit modulated signal DM (for example −8~+7) by PWM encoding; it is also feasible to encode only part of the range. Under this circumstance, the aforementioned number of PWM time slots M may be adjusted correspondingly. As another example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. The spirit of the present invention should cover all such and other modifications and variations, which should be interpreted to fall within the scope of the following claims and their equivalents.

What is claimed is:

1. A Digital to Analog Converter (DAC) circuit, configured to operably convert a digital signal to an analog output signal, wherein the digital signal is an input signal to the DAC circuit or a modulated signal generated from the input signal, the digital signal representing a number in a numerical range, the DAC circuit comprising:
  a Pulse Width Modulation (PWM) encoding circuit, configured to operably convert the digital signal to a first PWM signal and a second PWM signal, whereby a combination of the first PWM signal and the second PWM signal becomes a PWM encoded signal of at least 3 levels including a positive, a zero and a negative level, wherein in one PWM cycle period, the first PWM signal includes a first predetermined number of rising edges and falling edges, and the second PWM signal includes a second predetermined number of rising edges and falling edges, wherein when the digital signal represents a middle number in the numerical range, the first PWM signal has a minimum duty larger than 0 and the second PWM signal has a minimum duty larger than 0; and
  a demodulation circuit, configured to operably generate the analog output signal according to the first and the second PWM signals,
  wherein the zero level of the PWM encoded signal has a duty which decreases as an absolute difference between the number represented by the digital signal and the middle number increases.

2. The DAC circuit of claim 1, wherein the demodulation circuit includes:
  a current signal converter circuit, configured to operably generate a current output signal of at least 3 levels according to the first and the second PWM signals, wherein when the PWM encoded signal is at the zero level, the current output signal is a zero level current, wherein a noise of the zero level current is smaller than ⅕ of a noise of a current of any other level; and
  a filter circuit, configured to operably filter the current output signal to generate the analog output signal.

3. The DAC circuit of claim 2, wherein the noise of the zero level current is smaller than ¹/₁₀ of the noise of the current of any other level.

4. The DAC circuit of claim 2, wherein the zero level current is smaller than ¹/₁₀ of the current of any other level.

5. The DAC circuit of claim 1, wherein in one PWM cycle period, for each number represented by the digital signal, each of the first and the second PWM signals includes one and only one rising edge and one and only one falling edge.

6. The DAC circuit of claim 1, wherein when the number represented by the digital signal is larger than the middle number, a duty of the first PWM signal increases as the absolute difference between the number represented by the digital signal and the middle number increases, and when the number represented by the digital signal is smaller than the middle number, a duty of the second PWM signal increases as the absolute difference between the number represented by the digital signal and the middle number increases.

7. The DAC circuit of claim 2, wherein the current signal converter circuit includes:
  a current source circuit, configured to operably generate a unit current, and
  plural conversion switches coupled to the current source circuit, wherein the first and the second PWM signals operate the plural conversion switches to switch a current path of the unit current for generating the current output signal with at least 3 levels, wherein when the PWM encoded signal is at the zero level, the current output signal is disconnected from the current source circuit such that the current output signal is the zero level current.

8. The DAC circuit of claim 1, wherein each of the first and the second PWM signals has a blank time slot in the PWM cycle period, and for each number represented by the digital signal, the first PWM signal includes a first predetermined number of rising edges and falling edges outside of the blank time slot in the PWM cycle period, and the second PWM signal includes a second predetermined number of rising edges and falling edges outside of the blank time slot in the PWM cycle period.

9. The DAC circuit of claim 1, further including:
an interpolation filter circuit, configured to operably filter and up-sample the input signal to generate an interpolation filtered signal; and
a Sigma-Delta Modulation (SDM) circuit, configured to operably modulate the interpolation filtered signal with a multi-bit sigma-delta modulation for generating the modulated signal, wherein the modulated signal includes multiple bits.

10. The DAC circuit of claim 1, wherein a duty of the first PWM signal determines a duty of the positive level of the PWM encoded signal, and a duty of the second PWM signal determines a duty of the negative level of the PWM encoded signal.

11. A digital to analog conversion method, for converting a digital signal to an analog output signal, wherein the digital signal is an input signal to a DAC circuit or a modulated signal generated from the input signal, the digital signal representing a number in a numerical range, the method comprising:
converting the digital signal to a first PWM signal and a second PWM signal, whereby a combination of the first PWM signal and the second PWM signal becomes a PWM encoded signal of at least 3 levels including a positive, a zero and a negative level, wherein in one PWM cycle period, the first PWM signal includes a first predetermined number of rising edges and falling edges, and the second PWM signal includes a second predetermined number of rising edges and falling edges, wherein when the digital signal represents a middle number in the numerical range, the first PWM signal has a minimum duty larger than 0 and the second PWM signal has a minimum duty larger than 0; and
generating the analog output signal according to the first and the second PWM signals,
wherein the zero level of the PWM encoded signal has a duty which decreases as an absolute difference between the number represented by the digital signal and the middle number increases.

12. The digital to analog conversion method of claim 11, wherein the step of generating the analog output signal includes:
generating a current output signal of at least 3 levels according to the first and the second PWM signals, wherein when the PWM encoded signal is at the zero level, the current output signal is a zero level current, wherein a noise of the zero level current is smaller than ⅕ of a noise of a current of any other level; and
filtering the current output signal to generate the analog output signal.

13. The digital to analog conversion method of claim 12, wherein the noise of the zero level current is smaller than 1/10 of the noise of the current of any other level.

14. The digital to analog conversion method of claim 12, wherein the zero level current is smaller than 1/10 of the current of any other level.

15. The digital to analog conversion method of claim 11, wherein in one PWM cycle period, for each number represented by the digital signal, each of the first and the second PWM signals includes one and only one rising edge and one and only one falling edge.

16. The digital to analog conversion method of claim 11, wherein the step of converting the digital signal to a first PWM signal and a second PWM signal further includes:
when the number represented by the digital signal is larger than the middle number, increasing a duty of the first PWM signal as the absolute difference between the digital signal and the middle number increases; and
when the number represented by the digital signal is smaller than the middle number, increasing the duty of the second PWM signal as the absolute difference between the digital signal and the middle number increases.

17. The digital to analog conversion method of claim 11, wherein the step of generating the current output signal includes:
generating a unit current, and
switching a current path of the unit current by the first and the second PWM signals to generate the current output signal with at least 3 levels, wherein when the PWM encoded signal is at the zero level, the current output signal is disconnected from the current path to generate the zero level current.

18. The digital to analog conversion method of claim 11, wherein each of the first and the second PWM signals has a blank time slot in the PWM cycle period, and for each number represented by the digital signal, the first PWM signal includes a first predetermined number of rising edges and falling edges outside of the blank time slot in the PWM cycle period, and the second PWM signal includes a second predetermined number of rising edges and falling edges outside of the blank time slot in the PWM cycle period.

19. The digital to analog conversion method of claim 11, further including:
filtering and up-sampling the input signal to generate an interpolation filtered signal; and
modulating the interpolation filtered signal with a multi-bit sigma-delta modulation to generate the modulated signal, wherein the modulated signal includes multiple bits.

20. The digital to analog conversion method of claim 11, wherein a duty of the first PWM signal determines a duty of the positive level of the PWM encoded signal, and a duty of the second PWM signal determines a duty of the negative level of the PWM encoded signal.

* * * * *